(12) United States Patent
Ko et al.

(10) Patent No.: US 8,575,617 B2
(45) Date of Patent: Nov. 5, 2013

(54) THIN FILM TRANSISTOR ARRAY HAVING IMPROVED CONNECTIVITY BETWEEN SHORTING BAR AND DATA LINES

(75) Inventors: Gwang-Bum Ko, Asan-si (KR); Sang Jin Jeon, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/465,855

(22) Filed: May 7, 2012

(65) Prior Publication Data

US 2012/0326148 A1 Dec. 27, 2012

(30) Foreign Application Priority Data

Jun. 27, 2011 (KR) .................. 10-2011-0062438

(51) Int. Cl.
| H01L 29/04 | (2006.01) |
| H01L 29/15 | (2006.01) |
| H01L 31/036 | (2006.01) |
| H01L 29/10 | (2006.01) |
| H01L 31/0376 | (2006.01) |
| H01L 31/20 | (2006.01) |

(52) U.S. Cl.
USPC .... 257/72; 257/59; 257/E29.117; 257/E29.151; 257/E29.202; 257/E29.273; 257/E29.274; 257/E29.287; 257/E29.291; 257/E29.294; 257/E29.295

(58) Field of Classification Search
USPC ............. 257/59, 72, E29.117, E29.151, 257/E29.202, E29.273, E29.274, E29.287, 257/E29.291, E29.294, E29.295
See application file for complete search history.

(56) References Cited

U.S. PATENT DOCUMENTS

| 5,598,283 | A  | * | 1/1997  | Fujii et al. ...................... 349/143 |
| 6,801,288 | B1 | * | 10/2004 | Ashizawa et al. ............. 349/149 |
| 6,833,890 | B2 | * | 12/2004 | Hong et al. .................... 349/106 |
| 7,649,586 | B2 | * | 1/2010  | Kim et al. ........................ 349/54 |
| 7,746,417 | B2 | * | 6/2010  | Lim et al. ........................ 349/40 |
| 8,004,016 | B2 | * | 8/2011  | Seong et al. .................. 257/208 |
| RE42,670  | E  | * | 9/2011  | Park et al. ........................ 257/59 |
| 8,330,883 | B2 | * | 12/2012 | Tsubata et al. .................. 349/38 |
| 8,400,604 | B2 | * | 3/2013  | Cho et al. ...................... 349/141 |
| 8,405,787 | B2 | * | 3/2013  | Liu et al. .......................... 349/39 |
| 8,482,498 | B2 | * | 7/2013  | Lin et al. .......................... 345/87 |
| 2002/0027621 | A1 | * | 3/2002 | Chae ................................ 349/40 |
| 2003/0133067 | A1 | * | 7/2003 | Park et al. ...................... 349/141 |
| 2007/0120152 | A1 | * | 5/2007 | Chang et al. .................. 257/270 |
| 2007/0194705 | A1 | * | 8/2007 | Sung et al. .................... 313/506 |
| 2009/0315880 | A1 | * | 12/2009 | Cho et al. ...................... 345/214 |
| 2010/0033664 | A1 | * | 2/2010 | Lee ................................ 349/139 |

\* cited by examiner

*Primary Examiner* — Ida M Soward
(74) *Attorney, Agent, or Firm* — Innovation Counsel LLP (57) ABSTRACT

A thin film transistor array panel and a manufacturing method therefor. A shorting bar for connecting a thin film transistor with data lines is formed separate from the data lines, and then the data lines and the shorting bar are connected through a connecting member. As a result, all the data lines are floated during manufacture, so that variation in etching speed between data lines does not occur. Since variation in etching speed between the data lines can be prevented, performance deterioration of the transistor caused by a thickness difference in the lower layer of the data line can be prevented, as can resulting deterioration in display quality. Also, the influence of static electricity can be reduced or eliminated. Furthermore, since the data lines and the shorting bar are connected to each other, the generation of static electricity can be prevented or reduced, and quality testing is more readily performed.

11 Claims, 6 Drawing Sheets

FIG.9

# THIN FILM TRANSISTOR ARRAY HAVING IMPROVED CONNECTIVITY BETWEEN SHORTING BAR AND DATA LINES

CROSS-REFERENCE TO RELATED APPLICATION

This application claims priority to, and the benefit of, Korean Patent Application No. 10-2011-0062438 filed in the Korean Intellectual Property Office on Jun. 27, 2011, the entire contents of which are incorporated herein by reference.

BACKGROUND OF THE INVENTION (a) Field of the Invention

Embodiments of the present invention relate generally to flat panel displays. a thin film transistor array panel and a manufacturing method thereof.

(b) Description of the Related Art

A liquid crystal display, which is a popular type of flat panel display, typically includes two display panels having electrodes, and a liquid crystal layer interposed between the two display panels. The display controls the amount of light transmitted by applying voltage to the electrodes, thus rearranging liquid crystal molecules of the liquid crystal layer.

One of the two display panels constituting the liquid crystal display is a thin film transistor (TFT) array panel. The thin film transistor array panel is used to independently drive each pixel in a liquid crystal display, an organic electro-luminescence (EL) display device, or the like.

The thin film transistor array panel includes a scanning signal line or a gate line transmitting a scanning signal, an image signal line or a data line transmitting an image signal, a thin film transistor connected to the gate line and the data line, a pixel electrode connected to the thin film transistor, a gate insulating layer providing insulation by covering the gate line, and an interlayer insulating layer providing insulation by covering the thin film transistor and the data line.

Meanwhile, as display devices increase in size, the size of the thin film transistor array panel also increases. The increase in the size of the thin film transistor array panel increases the influence of static electricity generated during a manufacturing process. In order to reduce the influence of this static electricity, one of the odd-numbered data lines and one of the even-numbered data lines are connected to each other outside a display area, and a connection portion is then cut out. However, in this case, in an etching process for forming data lines, etching speed may vary as between data lines that are connected and data lines that are not connected, which results in a thickness difference in the lower layers of the data lines. This may compromise the performance of a thin film transistor of a thin film transistor array panel or compromise display quality, resulting in undesirable phenomena such as vertical lines or the like.

In order to prevent this difference in etching speed, all the wirings may be formed without being connected. In this case, the influence of static electricity increases, and the thin film transistor thus typically cannot undergo a quality test, therefore allowing a greater number of defects.

The above information disclosed in this Background section is only for enhancement of understanding of the background of the invention and therefore it may contain information that does not form the prior art.

SUMMARY OF THE INVENTION

Embodiments of the present invention provide a thin film transistor array panel and a corresponding manufacturing method that reduce or prevent variation in etching speed between data lines during an etching process for forming data lines, thus reducing or preventing deterioration in display quality and in performance of transistors that is caused by thickness differences in their data lines. Additional advantages include reduction or elimination of the influence of static electricity, and more readily performed quality testing.

An exemplary embodiment of the present invention provides a thin film transistor array panel having a display area and a peripheral area around the display area. The thin film transistor array panel includes: a plurality of gate lines and a plurality of data lines disposed in the display area and disposed on an insulation substrate; a shorting bar disposed in the peripheral area, disposed on the insulation substrate, and separated or spaced apart from the data lines; and a connecting member disposed on the substrate over both the shorting bar and at least some of the data lines, so as to electrically connect the at least some of the data lines with the shorting bar.

The shorting bar and the data line may be formed from the same layer.

The thin film transistor array panel may further include: a thin film transistor connected to the gate line and the data line; and a first field generating electrode connected to a drain electrode of the thin film transistor, wherein the first field generating electrode and the connecting member may be formed from the same layer.

The first field generating electrode may cover at least a portion of the drain electrode.

The connecting member may be cover at least a portion of the data line and at least a portion of the shorting bar.

The data line may include a first layer including titanium (Ti), and a second layer including copper (Cu).

In exemplary embodiments of the present invention, a shorting bar and data lines are formed separate from each other. The data lines and the shorting bar are then connected to each other through a connecting member. According to exemplary embodiments of the present invention, all the data lines are floated during panel manufacture, so that variation in etching speed between data lines is reduced or eliminated. Since the difference in etching speed between the data lines can be reduced or prevented, resulting performance deterioration of the transistor (caused by thickness differences in the lower layer of the data lines) and deterioration in display quality can be reduced or prevented, as can the influence of static electricity. Also, since the data lines and the shorting bar are connected to each other, the generation of static electricity can be prevented, and quality testing is more readily performed.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
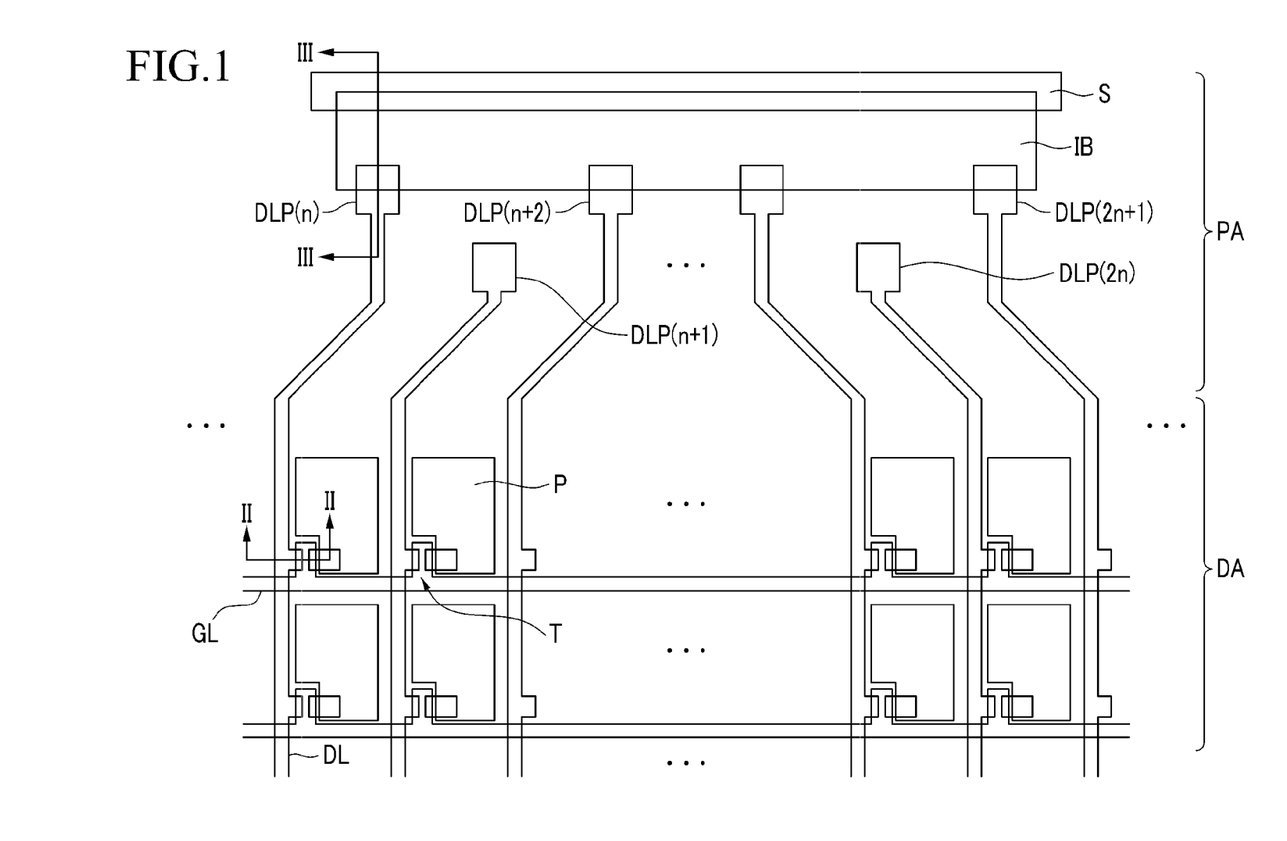
FIG. 1 is a layout view of a thin film transistor array panel according to an exemplary embodiment of the present invention.

Referring to FIG. 1, a thin film transistor array panel according to an exemplary embodiment of the present invention will now be described. FIG. 1 is a layout view of a thin film transistor array panel according to an exemplary embodiment of the present invention.

Referring to FIG. 1, a thin film transistor array panel according to an exemplary embodiment of the present invention includes a display area DA including a plurality of pixels to display an image, and a peripheral area PA disposed around the display area.

The display area includes a plurality of gate lines GL, a plurality of data lines DL, a plurality of transistors T, and a plurality of pixel electrodes P connected to the transistors T.

The peripheral area PA includes data pad parts DLP, and a shorting bar S. The data pad part DLP is located at one end of each data line DL disposed in the display area. Some data pad parts DLP(n), DLP(n+2), . . . , and DLP(2n+1) of the data pad parts DLP are connected to the shorting bar S through a connecting member IB.

Figure 2:
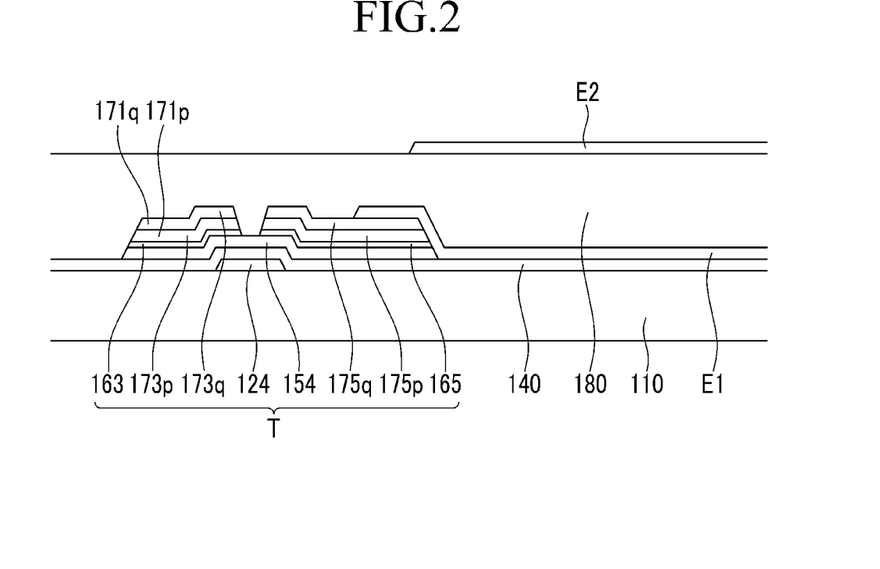
FIG. 2 is a cross-sectional view taken along line II-II of the thin film transistor array panel of FIG. 1 according to the exemplary embodiment of the present invention.

Hereinafter, a layer structure of a thin film transistor array panel according to an exemplary embodiment of the present invention will be described with reference to FIG. 2 and FIG. 3. FIG. 2 is a cross-sectional view taken along line II-II of the thin film transistor array panel of FIG. 1, and FIG. 3 is a cross-sectional view taken along line III-III of the thin film transistor array panel of FIG. 1.

Figure 3:
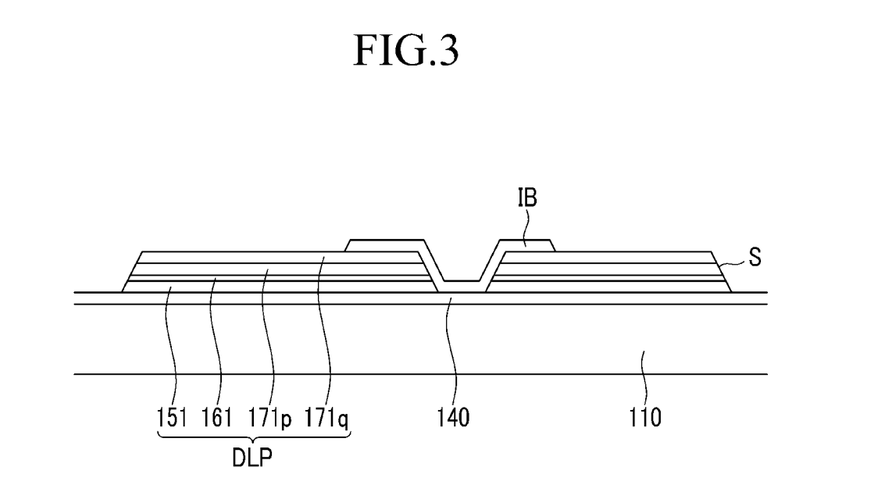
FIG. 3 is a cross-sectional view taken along line III-III of the thin film transistor array panel of FIG. 1 according to the exemplary embodiment of the present invention.

Referring to FIG. 1 together with FIG. 2 and FIG. 3, each gate line GL, including its gate electrodes 124, is disposed on an insulating substrate 110 formed of transparent glass, plastic or the like.

The gate lines GL transmit gate signals, and extend chiefly in a horizontal direction. Each gate line GL includes a plurality of gate electrodes 124 protruding from the gate line GL, and an end portion (not shown) having a wider area for connection to another layer or to an external driving circuit.

A gate insulating layer 140 formed of silicon nitride (SiNx), silicon oxide (SiOx) or the like is disposed on the gate line GL. A semiconductor 154, ohmic contacts 163 and 165, a data line DL including a source electrode 173, a drain electrode 175, and a shorting bar S are disposed on the gate insulating layer 140.

Each data line DL transmits a data signal, and extends chiefly in a vertical direction to intersect the gate line GL. The data line DL includes source electrodes 173 extending toward the gate electrode 124. The drain electrodes 175 are separated from the data line DL, and face respective source electrodes 173 while each pair of electrodes 173, 175 are centered over a respective gate electrode 124.

A single gate electrode 124, a single source electrode 173, and a single drain electrode 175 collectively constitute a single thin film transistor TFT together with the corresponding semiconductor 154, and a channel of the thin film transistor is disposed at the semiconductor 154 between the source electrode 173 and the drain electrode 175.

The data line DL and the drain electrode 175 may include lower layers 171p, 173p, and 175p, and upper layers 171q, 173q, and 175q. The lower layers 171p, 173p, and 175p may include titanium (Ti), and the upper layers 171q, 173q, and 175q may include copper (Cu).

The shorting bar S may be formed simultaneously with the data line DL in and/or of the same layer. However, the shorting bar S may also be formed as a different layer on or in the same layer as the data line DL.

The semiconductor 154 has substantially the same plane shape as the data line DL, the drain electrode 175, and resistant ohmic contacts 163 and 165 thereunder (i.e., has substantially the same shape when viewed in plan view). However, the semiconductor 154 has exposed portions including a portion between the source electrode 173 and the drain electrode 175, which are not covered by either the data line DL or the drain electrode 175.

A semiconductor stripe layer 151 and an ohmic contact stripe 161 are disposed under the data line DL, and the semiconductor stripe layer 151 and the ohmic contact stripe 161 may have at least approximately the same plane shape as the data line DL.

A first field generating electrode E1 is disposed on a portion of the drain electrode 175 and the gate insulating layer 140, and a connecting member IB is disposed on the shorting bar S and the data pad part DLP, which is the end of the data line DL.

The connecting member IB and the first field generating electrode E1 may be simultaneously formed from the same layer. The connecting member IB and the first field generating electrode E1 may be made of a transparent conductive material such as ITO or IZO, or reflective metal such as aluminum, silver, chromium or an alloy thereof.

The data pad part DLP and the shorting bar S are connected to each other by the connecting member IB.

A passivation layer 180 is disposed on the data line DL, the drain electrode 175, the exposed semiconductor 154, and the first field generating electrode E1.

The passivation layer 180 is formed of an inorganic insulator, an organic insulator, or the like, and may have a substantially flat surface. Examples of the inorganic insulator may include silicon nitride and silicon oxide. The organic insulator may have photosensitivity, and a dielectric constant of the organic insulator may be approximately 4.0 or less. However, the passivation layer 180 may include both a lower inorganic layer and an upper organic layer, so as not to harm the exposed portions of the semiconductor 154 while maintaining the desirable insulating properties of an organic layer.

A second field generating electrode E2 is disposed on the passivation layer 180.

In the thin film transistor array panel according to the exemplary embodiment of the present invention, the shorting bar is individually formed for connection between the thin film transistor and the data line, and for interconnecting the data lines. Subsequently, the connecting member covering the data lines and the shorting bar is formed together with the field generating electrode, thus connecting the data lines and the shorting bar with each other. Thus, all the data lines and the semiconductor layer are floated during the process of manufacturing the thin film transistor, preventing variation in the etching speed of the data lines and the semiconductor layer. Accordingly, variation in etching speeds among the data lines is reduced or prevented, thus preventing or reducing performance deterioration of the transistors that is caused by thickness differences in the lower layer of the data line. This in turn prevents deterioration in display quality, while also reducing or eliminating the influence of static electricity. More specifically, since the data lines are connected to the shorting bar, the generation of static electricity can be prevented, and a quality test becomes available.

Figure 4:
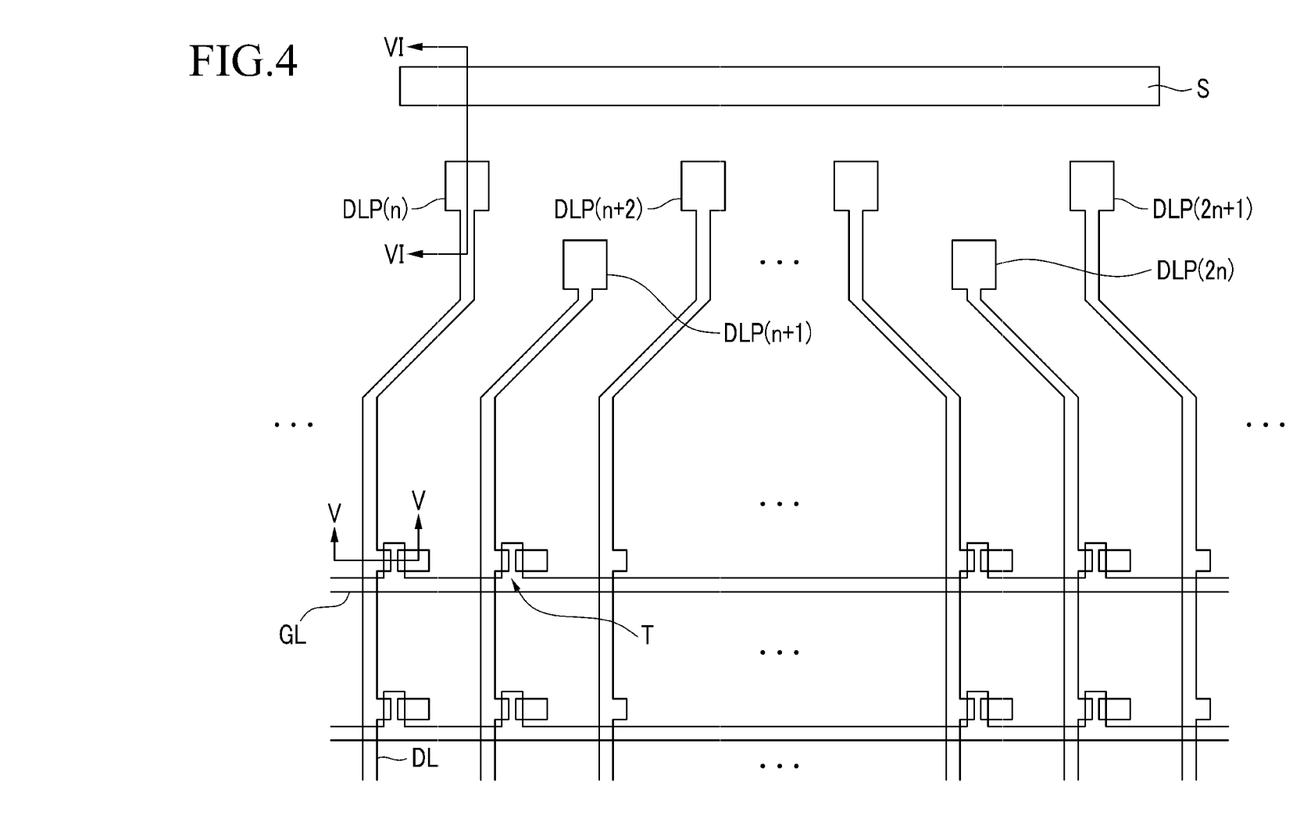
FIG. 4 and FIG. 7 are layout views sequentially illustrating a manufacturing method of the thin film transistor array panel according to an exemplary embodiment of the present invention.
Figure 5:
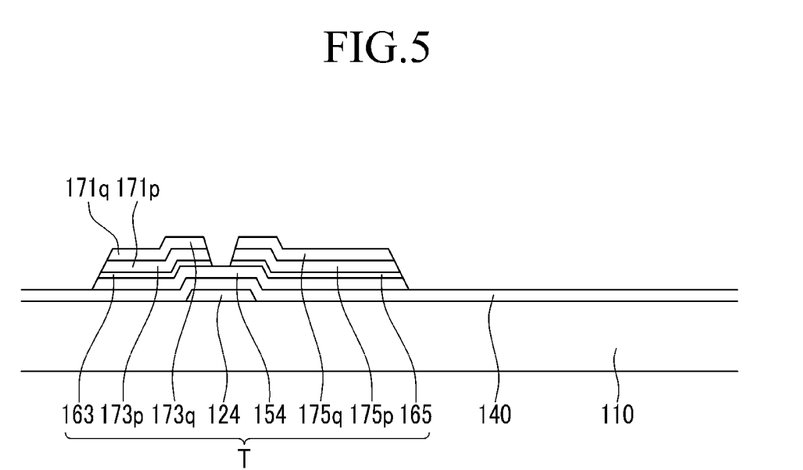
FIG. 5 is a cross-sectional view taken along line V-V of the thin film transistor array panel of FIG. 4.
Figure 6:
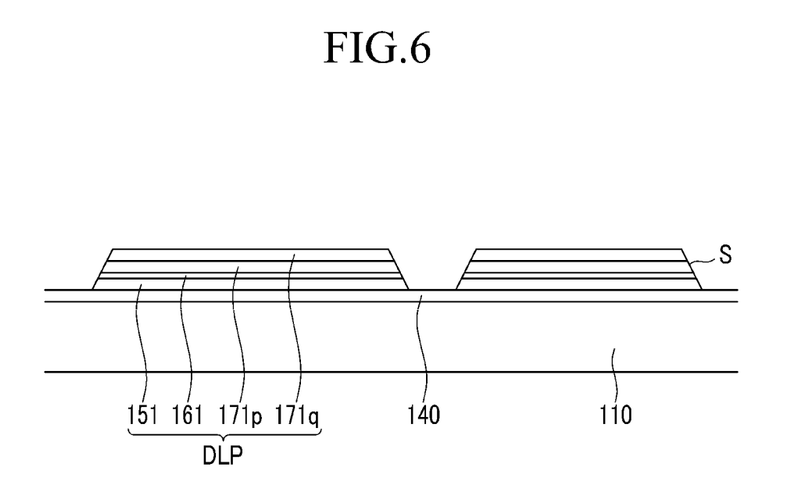
FIG. 6 is a cross-sectional view taken along line VI-VI of the thin film transistor array panel of FIG. 4.
Figure 7:
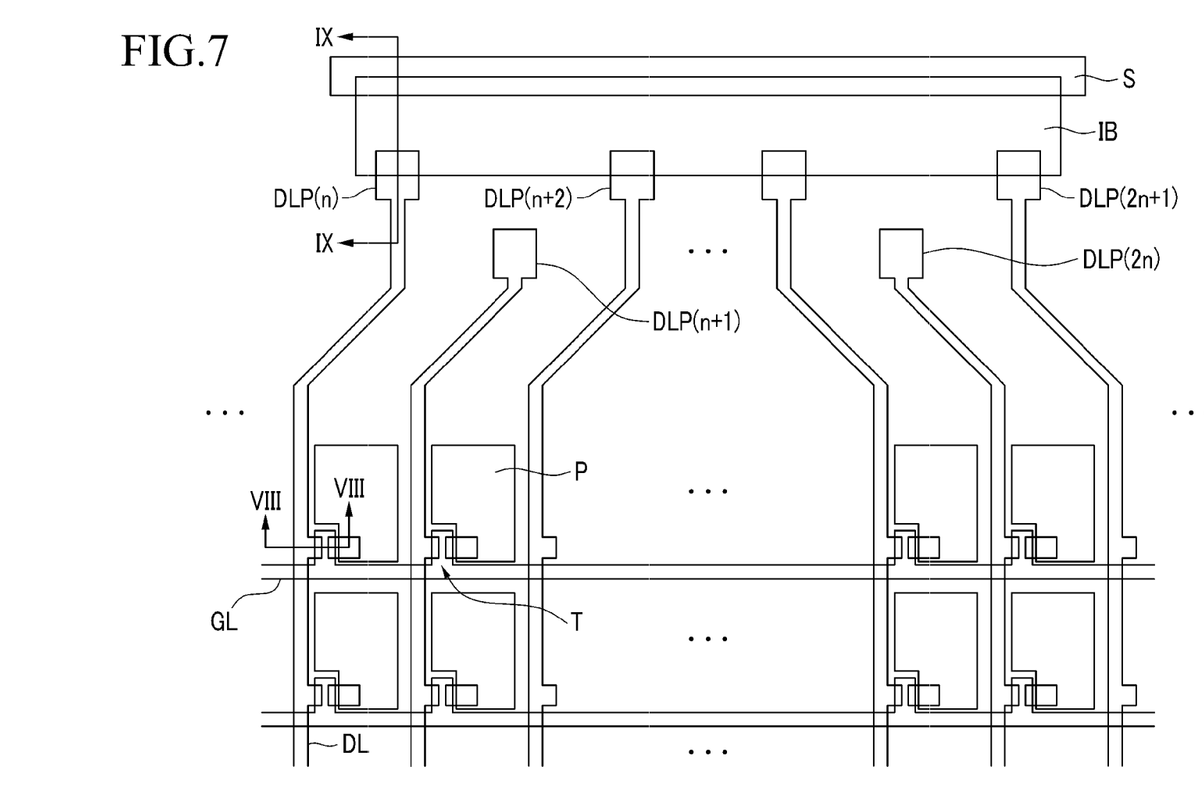
Figure 8:
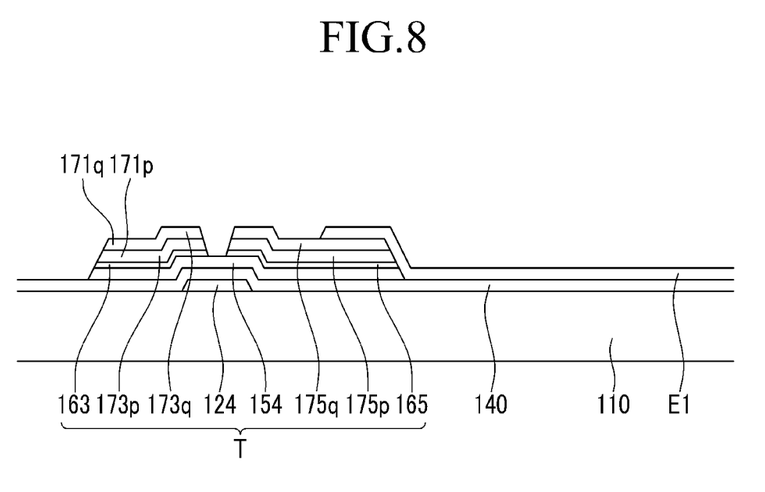
FIG. 8 is a cross-sectional view taken along line VII-VII of the thin film transistor array panel of FIG. 7.

Hereinafter, a manufacturing method of a thin film transistor array panel according to an exemplary embodiment of the present invention will be described with reference to FIG. 4 to FIG. 9. FIG. 4 and FIG. 7 are layout views of a thin film transistor array panel according to a manufacturing method of a thin film transistor array panel according to an exemplary embodiment of the present invention, FIG. 5 is a cross-sectional view taken along line V-V of the thin film transistor array panel of FIG. 4, and FIG. 6 is a cross-sectional view taken along line VI-VI of the thin film transistor array panel of FIG. 4. FIG. 8 is a cross-sectional view taken along line VIII-VIII of the thin film transistor array panel of FIG. 7, and FIG. 9 is a cross-sectional view taken along line IX-IX of the thin film transistor array panel of FIG. 7.

First, as shown in FIG. 4 to FIG. 6, a gate line GL (including gate electrodes 124) is formed on a substrate 110, a gate insulating layer 140 is formed on the gate line GL, and a semiconductor 154, ohmic contacts 163 and 165, a data line DL including a source electrode 173, a drain electrode 175, and a shorting bar S are formed on the gate insulating layer 140. The shorting bar S may be formed substantially simultaneously with the data line DL from the same layer, or may be formed as a different layer on the same layer as the data line DL.

The semiconductor 154, the ohmic contacts 163 and 165, the data line DL including the source electrode 173, the drain electrode 175, and the shorting bar S may be substantially simultaneously formed by using a single exposure mask.

Figure 9:
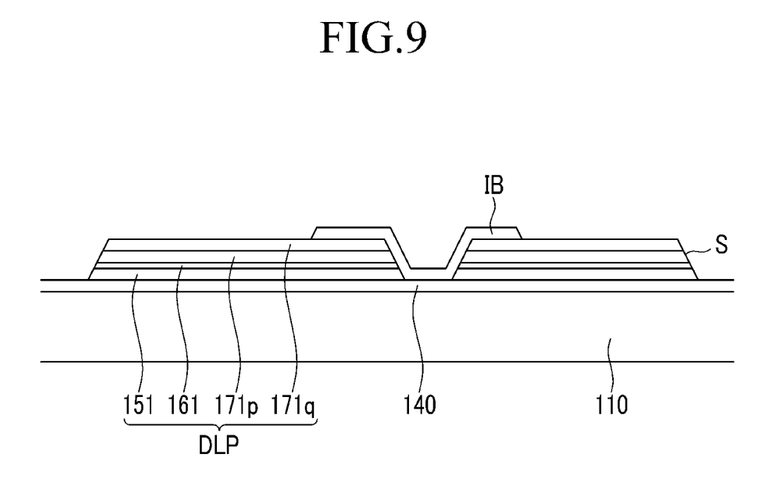
FIG. 9 is a cross-sectional view taken along line IX-IX of the thin film transistor array panel of FIG. 7.

Subsequently, as shown in FIG. 7 to FIG. 9, a first field generating electrode E1 is formed on a portion of the drain electrode 175 and the gate insulating layer 140, and a connecting member IB covering the end portion DLP of the data line DL and a portion of the shorting bar S to connect them is formed.

The connecting member IB and the first field generating electrode E1 may be formed together from the same layer. They may be formed of a transparent conductive material such as ITO or IZO, or a reflective metal such as aluminum, silver, chromium or an alloy thereof.

The data pad part DLP and the shorting bar S are connected with each other via the connecting member IB.

Since some of the data pad parts DLP are connected with the shorting bar S, if static electricity is generated in a thin film transistor, the static electricity passes through the shorting bar S and is diffused through a plurality of data lines DL connected to a plurality of thin film transistors. Accordingly, damage to the thin film transistors caused by static electricity can be reduced or prevented.

At this stage, a test signal is applied through the shorting bar S in order to determine whether or not a voltage is properly applied to the data line DL. In this manner, a defect occurring in the data line DL connected to the shorting bar S can be detected. That is, in the process of connecting the data line DL with the shorting bar S through the connecting member IB, a process of detecting a defect of the data line DL may also be performed.

Thereafter, as shown in FIG. 1 to FIG. 3, a passiviation layer 180 is stacked or deposited on the data line DL, the drain electrode 175, the exposed semiconductor 154, and the first field generating electrode E1. Subsequently, a second field generating electrode E2 is formed on the passivation layer 180.

In the case of the thin film transistor array panel according to the above exemplary embodiment described above, both the first field generating electrode E1 and the second field generating electrode E2 are formed on the thin film transistor array panel. However, in a thin film transistor array panel according to another exemplary embodiment of the present invention, the second field generating electrode E2 may be formed on a different display panel facing the thin film transistor array panel.

As described above, in the thin film transistor array panel and the manufacturing method thereof according to an exemplary embodiment of the present invention, the shorting bar for connecting the thin film transistor with the data line and connecting the data lines with each other is separately formed, and the shorting bar and the data lines are connected with each other through an additional connecting member. Accordingly, all the data lines are floated in the manufacturing process such that the variation in an etching speed between data lines is reduced or eliminated. Since the variation in etching speed between the data lines is reduced/prevented, performance deterioration of the transistor that is caused by a thickness difference in the lower layer of the data line, and resulting deterioration in display quality, can be prevented. Additionally, the influence of static electricity can be reduced or eliminated. Also, since the data lines and the shorting bar are connected, the generation of static electricity can be prevented, and a quality test can be performed during or shortly after connection of the data lines to the shorting bar.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel having a display area and a peripheral area outside the display area, comprising:
   a plurality of gate lines and a plurality of data lines disposed in the display area and disposed on an insulation substrate;
   a shorting bar disposed in the peripheral area, on the insulation substrate, and spaced apart from the data lines; and
   a connecting member disposed on the substrate over both the shorting bar and at least some of the data lines, so as to electrically connect the at least some of the data lines with the shorting bar.

2. The thin film transistor array panel of claim 1, wherein the shorting bar and the data line are formed from the same layer.

3. The thin film transistor array panel of claim 2, further comprising:
   a thin film transistor connected to the gate line and the data line; and a first field generating electrode connected to a drain electrode of the thin film transistor, wherein the first field generating electrode and the connecting member are formed from the same layer.

4. The thin film transistor array panel of claim 3, wherein the first field generating electrode covers at least a portion of the drain electrode.

5. The thin film transistor array panel of claim 4, wherein the connecting member covers at least a portion of the data line and at least a portion of the shorting bar.

6. The thin film transistor array panel of claim 5, wherein the data line includes a first layer including titanium (Ti), and a second layer including copper (Cu).

7. The thin film transistor array panel of claim 1, further comprising:

a thin film transistor connected to the gate line and the data line; and a first field generating electrode connected to a drain electrode of the thin film transistor, wherein the first field generating electrode and the connecting member are formed from the same layer.

8. The thin film transistor array panel of claim 7, wherein the first field generating electrode covers at least a portion of the drain electrode.

9. The thin film transistor array panel of claim 8, wherein the connecting member covers at least a portion of the data line and at least a portion of the shorting bar.

10. The thin film transistor array panel of claim 9, wherein the data line includes a first layer including titanium (Ti), and a second layer including copper (Cu).

11. The thin film transistor array panel of claim 1, wherein the connecting member covers at least a portion of the data line and at least a portion of the shorting bar.

* * * * *